(12) United States Patent
Slater et al.

(10) Patent No.: US 7,648,821 B2
(45) Date of Patent: Jan. 19, 2010

(54) METHOD OF FORMING FLEXIBLE ELECTRONIC CIRCUITS

(75) Inventors: Sean D. Slater, Meldreth (GB); John R. Fyson, Hackney (GB); Christopher B. Rider, Hardwick (GB); David T. Clarke, Hemel Hempstead (GB); Jurjen F. Winkel, Ely (GB); Peter Hewitson, Uxbridge (GB)

(73) Assignee: Eastman Kodak Company, Rochester, NY (US)

( * ) Notice: Subject to any disclaimer, the term of this patent is extended or adjusted under 35 U.S.C. 154(b) by 193 days.

(21) Appl. No.: 11/911,825

(22) PCT Filed: Mar. 24, 2006

(86) PCT No.: PCT/GB2006/001098

§ 371 (c)(1),
(2), (4) Date: Oct. 18, 2007

(87) PCT Pub. No.: WO2006/111697

PCT Pub. Date: Oct. 26, 2006

(65) Prior Publication Data

US 2008/0199665 A1    Aug. 21, 2008

(30) Foreign Application Priority Data

Apr. 22, 2005    (GB) ................................. 0508189.8

(51) Int. Cl.
*G03C 5/18* (2006.01)
*G03C 5/26* (2006.01)
*G03C 1/08* (2006.01)
(52) U.S. Cl. ..................................... 430/401; 430/508
(58) Field of Classification Search ................. 430/401, 430/508

See application file for complete search history.

(56) References Cited

U.S. PATENT DOCUMENTS

| | | |
|---|---|---|
| 3,424,581 A | 1/1969 | Nawn et al. |
| 3,885,966 A | 5/1975 | Gracia et al. |
| 4,469,777 A | 9/1984 | O'Neil |
| 2008/0206689 A1* | 8/2008 | Brooks et al. ............... 430/401 |

FOREIGN PATENT DOCUMENTS

DE    1 938 373    2/1971

OTHER PUBLICATIONS

JP Abstract 03-171043 (Fuji).

* cited by examiner

*Primary Examiner*—Geraldina Visconti (57) ABSTRACT

A multiple layer photosensitive element having at least three differently sensitised photosensitive layers on one side of a support, such as a, transparent flexible support, is imagewise exposed according to a desired circuit pattern and developed to form two layers of conductive track patterns from each photosensitive layer, which may then be connected together by forming vias by drilling or in situ generation. The resulting multiple layer conductive element has application in the field of printed circuit board manufacture or as the backplane electronic element of a flexible display device.

13 Claims, 1 Drawing Sheet

FIG. 1

METHOD OF FORMING FLEXIBLE ELECTRONIC CIRCUITS

FIELD OF THE INVENTION

The present invention relates to formation of conductive materials as conductive tracks for and in electronic circuit boards and devices utilising such conductive tracks. The invention is particularly concerned with the formation of conductive tracks or electronic circuits of high resolution (i.e. fine tracks) in a manner which minimises registration problems between two layers of electronic circuitry, and utilises photosensitive materials in the generation of conductive tracks for electronic circuit boards and thin and flexible display applications.

BACKGROUND OF THE INVENTION

In the imaging, lighting, display and electronics industries, it is predicted that in order to meet consumer demands, and fuelled by industry competitiveness, electronics products will be required to be increasingly durable, thin, lightweight and of low cost. In a growing market where consumers are demanding more from portable electronic devices and displays such as mobile phones, laptop computers, etc., flexible displays and electronics have the potential to eliminate the rigid constraints of traditional flat panel displays and electronics products. The goal in displays and electronics is to produce thin, lightweight, flexible devices and displays with achievable power requirements at a minimal cost.

Traditionally electronic devices requiring multiple layers of circuits have been fabricated using multiple circuit boards, with circuitry formed on one or both sides thereof, which may be bonded together and connected to one another by drilling holes (or vias) in the circuit boards which are filled with conductive material. To make such multiple layer circuit boards, a copper coated insulating board made of a composite material is treated with a light-sensitive material, known as a photoresist, which is imaged with the pattern of the desired electronic circuit, typically by exposing the photoresist through a photomask. The resist is affected by the exposure such that the exposed and non-exposed parts can be differentiated in terms of ease or method of removal. The imaged resist is then treated to remove the resist in an image-wise manner to reveal bare copper. The bared copper is then etched away and then the remaining resist removed to reveal a copper track on the insulating board. A second board may be made in a similar way with its own circuit pattern and the two boards bonded together and optionally connected by drilling vias as mentioned above.

The process of making electronic circuit boards such as this can be quite laborious and involves several sequential steps. A problem with making multiple layer circuit boards in this way, especially boards of greater than one meter across, is that it is not always possible to register the boards accurately. The photomasks used to image the photoresist-coated copper-clad boards are often subject to dimensional instability. For example, a mask, which is usually a photographic film, typically exhibits a humidity expansion coefficient of about 0.0012% per percent relative humidity, such that on a 5% change in relative humidity, a one meter photomask will expand or contract by about 60 μm. Polyester film has a thermal expansion coefficient of 0.0018% per ° C., such that a 5° C. change will result in a dimensional change of 90 μm and the effect of humidity expansion and thermal expansion can be cumulative. The conductive track resolution available by this method is therefore severely limited by the dimensional instability of the photomask, in that if it was desired to connect tracks of 50 μm width on one circuit board with that of another circuit board by drilling a via, a possible positional error of greater than 50 μm may hinder connection.

It is desirable to provide a solution to overcome the problem of registration in printed circuit board manufacture, to improve the efficiency of the electronic circuit manufacturing process and to enable electronic circuits to be generated on flexible supports to meet the predicted growth in demand for flexible circuits and flexible and thin devices. A number of attempts to provide new manners of manufacturing electronic circuits have been previously disclosed.

U.S. Pat. No. 4,469,777 relates to a process for preparing a two-layer printed circuit having conductive interconnections, via a single exposure. According to the process described, at least one layer of a photoadhesive material is laminated onto a substrate bearing an electrically conductive circuit and then exposed to actinic radiation through a photomask of three different optical densities, one that transmits substantially all the radiation, one that transmits substantially no radiation and one that transmits an intermediate amount of radiation. The areas of the coated substrate exposed to substantially no radiation are removed by application of a suitable solvent in which the exposed photoadhesive material is insoluble, to form holes for vias. Finely divided metal, alloy or plating catalyst is applied to the adherent image areas (optionally tackified by heating) which correspond to the areas exposed to light of intermediate optical density and which correspond to a desired circuit pattern and to the holes to form interconnecting vias (connecting the circuit pattern on the substrate to the circuit pattern on the surface of the laminated photoadhesive material). The pattern is then plated to generate an electrically conductive circuit pattern interconnected with the underlying pattern. Further layers of circuit may be formed by repeating the process.

U.S. Pat. No. 5,384,230 describes a method of fabricating printed circuit boards whereby the surface of a circuit board is covered with a photoresist layer and the photoresist layer in turn covered with a silver halide emulsion layer. The silver halide emulsion layer is then exposed according to a desired circuit board pattern with white light and the image developed to form a high definition mask in direct contact with the resist. The board is then exposed to UV light through the imaged emulsion layer, which is then stripped and the exposed photoresist-coated board processed in the conventional manner.

U.S. Pat. No. 2,854,386 relates to a method of photographically printing conductive metal patterns. As described therein, a thin layer of a photographic silver halide emulsion coated onto a support is exposed according to a desired pattern through a master transparency to generate a latent image which forms a dense and visible silver image upon development, preferably with a high contrast, non-fogging developer. The visible silver image formed is a negative of the final desired pattern. An oxidising etch solution is then applied which oxidises the metallic silver and simultaneously softens the associated gelatin thereby removing the gelatin from the support to leave a residual gelatin image. A latent silver image is formed in the residual gelatin image by re-exposing the whole support to actinic radiation and the silver nuclei act as seeds in the subsequent physical development step to form a heavy continuous conductive silver deposit. The resulting conductive silver pattern may be plated with copper or other metal according to standard electroplating techniques. In a second described embodiment, the emulsion is of a wash-off type emulsion comprising unhardened gelatin and a light sensitive tanning agent. The emulsion layer is exposed according to the desired pattern and non-pattern areas of gelatin removed by a wash-off developer to form a gelatin image of the desired pattern. A preliminary silver image is formed in the gelatin image by treating it with an alkaline solution and a silver salt, such as silver nitrate, whereby silver oxide particles are formed in the gelatin image, which then form the nuclei for forming a silver deposit via a physical development process and may optionally be electroplated with copper or other metal.

U.S. Pat. No. 2,195,531 describes a coating of nitrocellulose containing a photosensitive compound (silver bromide) and a conductor (carbon) on a cellulose acetate support, which is exposed according to a desired pattern and then developed, fixed and washed. The conductivity of the filn depends upon the amount of carbon and the amount of reduced metal compound therein. The developed element may be used as a resistance element or variable resistor.

U.S. Pat. No. 3,223,525 describes a method of manufacturing, by photographic means, external electrically conductive noble-metal patterns on non-conductive supports. In the described method, a non-conductive support is treated with a light-sensitive compound such as silver halide, exposed to light to produce a silver or mercury germ image, which is then treated with a stabilised physical developer for a prolonged period of time whereby the internal image is made to grow out beyond the surface of the support to become an external image having resistivity of less than $10^4$ ohms per square.

U.S. Pat. No. 3,929,483 describes a method by which one-sided and/or two-sided plated through conductive circuit boards useful for printed circuits may be produced. An anodized aluminum sheet sensitised (on one or both sides) with silver salts is exposed according to a circuit pattern and developed, optionally with a physical developer, to generate a silver image. This is treated with hypochlorite solution and then plated with a metal to form conductive tracks. Where tracks are formed on both sides of the support, they may be connected by drilling through the support using standard techniques or by utilising a pre-drilled support.

DE 198373 relates to the production of conductive strips, resistors, and capacitors by photographic means. It describes a photosensitive material comprising an insulating layer support coated with two photosensitive, fine grain silver chlorobromide emulsion layers having a gelatin/silver ratio of 1:3 and being sensitive to the blue, green or red region of the spectrum (optionally to different regions). The two silver chlorobromide emulsion layers are separated by a dielectric layer, which is permeable to photographic development baths and which preferably has a thickness of between 3 and 4 μm and optionally contains dielectrically active metal oxides such as $TiO_2$, $Al_2O_3$ and $SiO_2$. Exposure of the emulsion layers through a mask according to the desired conductive pattern in each layers followed by development using a photographic developer with a development accelerator leads to formation of respective electrically conductive layers. Connectivity between the upper and lower electrically conductive layers formed from the respective emulsion layers can be effected by applying the intermediate dielectric layer in strips, with the required intermediate spaces.

U.S. Pat. No. 3,647,456 relates to a method of making electrically conductive silver images with the object of providing such electrically conductive silver images having high spatial resolution, which conducting silver image may be advantageously utilised in printed circuit techniques thereby eliminating the need for an aluminium layer in photoresists and establishing a silver pattern directly upon a wafer. There is described the use of a coating of silver bromide emulsion comprising cadmium iodide on a substrate to produce a latent image on the substrate, developing the latent image using a high resolution developer to provide a silver image and heating the silver image at a temperature of from 200° C. to 450° C. to render the silver image electrically conductive.

U.S. Pat. No. 6,517,931 describes a method of using a conductive silver ink in the manufacture of multi-layer ceramic capacitor (MLC) devices. The silver ink described typically comprises at least a high purity silver powder having an average particle size of up to 1 μm; an inhibitor such as a barium titanate based material; and a vehicle comprising a mixture of resin (e.g. ethyl cellulose) and solvent (e.g. toluene/ethanol mixture). According to U.S. Pat. No. 6,517,931, the ink is screen-printed to a desired pattern on dielectric green tapes which are stacked to form a registry, laminated under pressure and then fired to form the MLC device.

The various alternative methods of generating printed circuit patterns illustrated in the above-referenced documents each has advantages as described therein, but they do not provide a solution to overcome the problem of registration in printed circuit board manufacture, to improve the efficiency of the electronic circuit manufacturing process and to enable electronic circuits to be generated on flexible supports to meet the predicted growth in demand for flexible circuits and flexible and thin devices.

PROBLEM TO BE SOLVED BY THE INVENTION

It is desirable to provide a method of forming interconnective conductive tracks in two or more layers which method avoids problems associated with registration of circuit patterns on a multi-layer circuit board.

It is further desirable to provide a method of forming conductive tracks which is more efficient and involves fewer steps in fabrication as compared with traditional printed circuit board manufacture.

It is still further desirable to provide a method capable of forming conductive tracks or conductive areas having gaps with very high resolution to meet the demands of increasingly complex circuitry of high-tech devices.

And it is still further desirable to provide a method of forming two or more layers of conductive tracks on a flexible support to meet the predicted growth in demand for flexible circuits and flexible and thin devices.

SUMMARY OF THE INVENTION

According to a first aspect of the invention, there is provided a method of manufacturing a multiple layer conductive element, said conductive element having three or more layers of electrically conductive material, each layer of conductive material being conductive according to a desired pattern, said method comprising the steps of providing a photosensitive element comprising:

a support having coated on at least one side thereof a first photosensitive layer sensitive to radiation of a first spectral region;

a second photosensitive layer sensitive to radiation of a second spectral region, said second photosensitive layer being located respectively further away from said support than said first photosensitive layer; and a photosensitive intermediate layer located between the first and second photosensitive layers, said photosensitive intermediate layer being sensitive to radiation of a third spectral region being different from that of the first and second spectral regions and said layer containing at least one of a polymer latex, polymer beads and dielectric particles, which photosensitive intermediate layer and first and second photosensitive layers are capable of, upon imagewise exposure according to a desired pattern and development, providing a metal image according to the desired pattern;

imagewise exposing each photosensitive layer and photosensitive intermediate layer of the photosensitive element with radiation of an appropriate wavelength according to respective desired conductive patterns for each photosensitive layer to form a latent image in each photosensitive layer; and developing the photosensitive element to form a conductive metal pattern corresponding to the pattern of each latent image.

According to a second aspect of the invention, there is provided a multiple layer conductive element obtainable by the above method.

According to a third aspect of the invention, there is provided a photosensitive element comprising:

a support having coated on at least one side thereof a first photosensitive layer sensitive to radiation of a first spectral region;

a second photosensitive layer sensitive to radiation of a second spectral region, said second photosensitive layer being located respectively further away from said support than said first photosensitive layer; and a photosensitive intermediate layer located between the first and second photosensitive layers, said photosensitive intermediate layer being sensitive to radiation of a third spectral region being different from that of the first and second spectral regions and said layer containing at least one of a polymer latex, polymer beads and/or dielectric particles, which first and second photosensitive layers and said photosensitive intermediate layer are capable of, upon imagewise exposure according to respective desired patterns and development, providing conductive metal images according to the desired patterns.

ADVANTAGEOUS EFFECT OF THE INVENTION

The method of the invention enables the formation of conductive tracks in two or more layers upon a flexible support substrate, having an insulating intermediate layer between layers of conductive tracks to prevent unwanted short circuiting and having a pattern of conducting connective posts to act as conductive vias, which method allows conductive tracks to be used to form circuits for flexible electronic devices, provides a thin two conductive layer and interconnective insulating layer arrangement, since only a single support substrate is required, and avoids possible difficulties with registration by pre-registering the two layers in which conductive patterns are to be formed and the interconnections between the two layers. The method also enables the multilayer conductive element to be fabricated more efficiently and in fewer steps than traditional printed circuit board methods, for at least the reason that each processing step may be carried out simultaneously on the interconnective insulating layer and the two or more layers in which conductive tracks are to be formed.

The method also provides the possibility of providing electrical circuitry necessary for display devices, particularly more complex display devices which may require more than one electrical contact per pixel on the same side.

The method and element of the present invention also has the advantage over prior art conductive track systems that very high resolution track widths and gaps are possible.

DETAILED DESCRIPTION OF THE INVENTION

The present invention is concerned with a method of manufacturing a multiple layer conductive element having at least two conductive layers, each with conductive pattern, on at least one side of a support. The multiple layer conductive element is obtained by imagewise exposing, according to a desired pattern, each of at least two photosensitive layers on at least one side of a support of a photosensitive element followed by developing the latent image formed to provide a conductive metal pattern. The at least two photosensitive layers on the photosensitive element according to the invention, referred to as a first photosensitive layer located respectively nearer the support and a second photosensitive layer located respectively further away from the support, are sensitised respectively to a first spectral region and a second spectral region, which first and second spectral regions may be the same, but are preferably different, or at least have a different wavelength of maximum absorption and little overlap.

For convenience, the conductive pattern formed in the layer of the multilayer conductive element corresponding to the first photosensitive layer shall be referred to as the first conductive pattern (and the conductive layer as the first conductive layer) and the conductive pattern formed in the layer of the multilayer conductive element corresponding to the second photosensitive layer shall be referred to as the second conductive pattern (and the conductive layer as the second conductive layer).

The first and second photosensitive layers of the photosensitive element according to the invention are separated by an intermediate layer. The intermediate layer should be such as to prevent unwanted conductivity between the conductive patterns formed according to the method of the present invention from the first and second photosensitive layers, which could otherwise cause the multiple layer conductive element to short circuit. In order to form electrical connections in a controlled manner between the conductive patterns of the multiple layer conductive element located in different layers, the intermediate layer of the photosensitive element, as well as being sufficiently insulating to prevent unwanted connections between the resultant first and second conductive patterns, is also photosensitive, which is sensitised to a different spectral region (having a different wavelength of maximum absorption) from that of the first and second photosensitive layers. The photosensitive intermediate layer may be used to generate vias in situ by exposing the intermediate layers only at the positions where it is intended to connect the first and second conductive patterns.

It may also be desirable to have a photosensitive insulating top layer in the photosensitive element to allow selective connection to the upper conductive patterned layer from the surface of the multilayer conductive element.

Optionally, the photosensitive element of the invention may comprise further photosensitive layers on the same side of the support as the first and second photosensitive layers, e.g. third and fourth photosensitive layers located respectively further from the support than the second photosensitive layer and separated from the second photosensitive layer and each other by further intermediate layers, which may be optionally photosensitive intermediate layers for generating in situ vias. In principle, there may be as many different photosensitive layers as desired, on either side of the support, which may be limited by the possible number of differently photosensitised layers and the design requirements.

The multiple layer conductive elements according to the present invention may be designed and utilised for a variety of different applications. For example, the elements may be used as electronic circuits in place of conventional printed circuit boards for conventional electronic devices, or as flexible electronic circuits for use in thin or flexible electronic devices. It may further find utility as a backplane circuit in the field of flexible displays and would find particularly useful application in such display devices requiring more than one connection per pixel of the display from the same side of the display device.

The multiple layer capability of the conductive elements according to the invention may be useful in display devices not only where two independent track patterns that cross in many places are required, but also where only a single track layout is required but which has a small number of crossovers where one track is required to cross over another track. The three conductive layer (two photosensitive layers and one photosensitive intermediate layer) embodiment is capable of providing for both these requirements. Such a crossover capability would find particular utility in such display applications as segmented displays.

Any suitable support may be used for the multiple layer conductive elements according to the invention and depending upon the application of the multiple layer conductive element. The support may be transparent or opaque, rigid or flexible. Suitable supports include, for example, conventional printed circuit board substrate, glass, paper, resin coated paper, polyethyleneterephthalate (PET), polyethylenenaphthalate (PEN) and cellulose triacetate. Preferred supports are flexible supports. An Estar® PET support or a cellulose triacetate support is preferable.

Alternatively, the support may be the same support used in a flexible display device, by which it is meant that the at least two photosensitive layers and the photosensitive intermediate layer may be coated onto the back of a support for a display device and imaged in situ according to a desired pattern in each layer and processed in situ.

Where a discrete support is utilised (i.e. the support is not the reverse side of a support for a flexible display device), it can be coated with photosensitive layers on both sides. For example, the multilayer conductive element may comprise 2, 3 or 4 conductive layers and 1, 2 or 3 connective intermediate layers on one side of the support and, optionally, 1, 2, 3 or 4 conductive layers and up to 3 connective intermediate layers on the other side of the support when prepared by a method according to the present invention.

Where the photosensitive element used in the method of the invention comprises two photosensitive layers and one photosensitive intermediate layer on one side of the support, the two photosensitive layers may be sensitised to the same or an overlapping spectral region, whereby the same conductive pattern may be imaged to each photosensitive layer, but preferably the first and second photosensitive layers are sensitised to first and second spectral regions having little overlap and having different absorption maxima. The photosensitive intermediate layer is sensitised to a spectral region of a different wavelength having little or no overlap and a different absorption maximum from that of the first and second photosensitive layers.

A photosensitive element having two layers on one side of the support sensitised to the same or a similar spectral region is envisaged which is capable of being imaged with a different pattern on each of the layers. In this embodiment, the support is transparent to exposing radiation within the spectral region to which the first and second layer are sensitised and the intermediate layer comprises a filter dye which is capable of absorbing radiation in the same spectral region to which the first and second photosensitive layers are sensitised. It would then be necessary to image the second photosensitive layer directly and to image the first photosensitive layer through the transparent support.

However, as mentioned above, the at least two photosensitive layers are preferably differently sensitised. Typically, the photosensitive layers will be exposed from the same side of the element, which will usually be the side of the support upon which the photosensitive layers are coated.

The photosensitive layers and photosensitive intermediate layer typically comprise any suitable photosensitive metal salt in a binder, which is typically a hydrophilic binder. By necessity, the binder is largely non-conducting, i.e. is sufficiently insulating to prevent short circuits forming between lines in the conductive patterns in a single conductive layer.

The photosensitive metal salt may be any suitable metal salt such as a photosensitive copper (I) salt or silver (I) salt and is preferably a photosensitive silver halide. The photosensitive metal salt is capable of forming a latent or germ image upon exposure to radiation to which it is sensitised. The latent or germ image should be capable of imagewise forming a conductive metal image upon development. A photosensitive silver halide material such as that described in U.S. Pat. Nos. 5,589,318 or 5,512,415 may be utilised.

The hydrophilic binder may be a hydrophilic colloid selected from gelatin or a gelatin derivative, polyvinylpyrrolidone or casein and may contain a polymer. Suitable hydrophilic colloids and vinyl polymers and copolymers are described in Section IX of the Research Disclosure referred to below. Gelatin is the preferred hydrophilic colloid. The intermediate layer may comprise any suitable polymer in an amount capable of electrically insulating the two conductive patterns formed, and it may be a gelatin, preferably with additives to reduce the conductivity and so reduce the likelihood of shorting occurring between the first and second conductive patterns. A suitable additive to the polymer material of the intermediate layer is present, for example to dilute the silver halide layer, and may be an insulating film-forming polymer, such as a polymer latex, or preferably polymer beads and/or dielectric particles (such as $SiO_2$, $Al_2O_3$, $TiO_2$).

The presence of polymeric beads such as, for example, polymethacrylate matte beads, maintains the local silver/gel ratio and, since the beads are spherical and stacked, a path can be maintained for the developed silver to make a conductive track between the first and second photosensitive layers, should that be required. Preferably the beads are smaller than 5 μm, preferably smaller than 3 μm, more preferably smaller than 1.5 μm, although beads of a mixture of sizes can also be used, such that a pathway can be maintained. The ratio of beads/silver by weight is generally from 1:5, preferably 1:2.5 although most preferably a 1:1 ratio is used.

The silver halide emulsion utilised in photographic films for use in the graphic arts or in the preparation of printed circuit boards are considered useful emulsion formulations according to the multiple layer photosensitive element of the present invention.

The emulsions employed in the photographic materials described herein, and the addenda added thereto, the binders, supports, etc., may be as described in Research Disclosure Item 36544, September 1994, published by Kenneth Mason Publications, Emsworth Hants, PO10 7DQ, UK.

Development of the exposed photosensitive layer to form the conductive metal pattern corresponding to the desired pattern may comprise one or more of conventional development, physical development and electrochemical development.

By conventional development, it is meant that the latent or germ image is treated with a developer composition, which may be incorporated in the photosensitive layer, but requires activation (e.g. by heating or changing pH), or may be added as a solution as part of a development process. The developer composition typically comprises a reducing agent capable of reducing the metal salt to the elemental metal, when catalysed by the elemental particles of the latent or germ image under the conditions of the development process.

By physical development or electroless plating, it is meant that the latent image (or the metal image formed by conventional development) is treated with a solution of a metal salt or complex of the same or different metal as that formed by conventional development of the latent image. Typically the physical development composition will further comprise a reducing agent to enable the physical development composition to be applied directly to the latent image.

By electrochemical development or electroplating, it is meant that a conductive metal image formed by conventional development and/or physical development has a voltage applied across it in the presence of a plating solution comprising a salt or complex of a plating metal, which may be the same or different from that of the metal image to be plated, whereby the conductive metal image is made more conductive. Suitable metals for use in electroplating include, for example, copper, lead, nickel, chromium, gold, and silver, preferably copper or silver and more preferably silver.

In the method of the invention, the exposed photosensitive element may be developed by applying a conventional development step and/or a physical development step and, optionally, an electrochemical development step. Where the development of the exposed photosensitive element comprises a conventional development step and an electrochemical development step (i.e. direct electroplating of a developed image), it is necessary that the image formed by conventional development is sufficiently conductive when a voltage is applied across it. In this case, it is preferable to use the electroplating technique described in our UK application No. 0508188.0 of even date entitled, "Method of Forming Conductive Tracks" (Fyson et al.)

The photosensitive element may also contain an overcoat hydrophilic colloid layer, which may also contain a vinyl polymer or copolymer located as the last layer of the coating (furthest from the support). It typically contains one or more surfactants to aid coatability and may also contain some form of matting agent. The vinyl polymer is preferably an acrylic polymer and preferably contains units derived from one or more alkyl or substituted alkyl acrylates or methacrylates, alkyl or substituted acrylamides, or acrylates or acrylamides containing a sulfonic acid group.

The photosensitive element described herein preferably includes an antihalation layer that may be on either side of the support, preferably on the opposite side of the support from the photosensitive layers (where the photosensitive layers are only applied to one side of a transparent support). In a preferred embodiment, an antihalation dye is contained in an hydrophilic colloid underlayer. Suitable antihalation dyes are listed in the Research Disclosure referred to above.

The preferred silver halide emulsions of the photosensitive layers may be prepared by any suitable method of grain growth, preferably using a balanced double run of silver nitrate and salt solutions using a feedback system designed to maintain the silver ion concentration in the growth reactor. Dopants may be introduced uniformly from start to finish of precipitation or may be structured into regions or bands within the silver halide grains. The dopants, for example, osmium dopants, ruthenium dopants, iron dopants, rhenium dopants and/or iridium dopants, for example cyanoruthenate dopants, may be added. Such complexes may alternatively be utilised as grain surface modifiers in the manner described in U.S. Pat. No. 5,385,817. Chemical sensitisation may be carried out by any of the known methods, for example with thiosulfate or other labile sulfur compound and with gold complexes. Preferably, the chemical sensitisation is carried out with thiosulfate and gold complexes.

After addition of the sensitising dye at a level to give the emulsion the desired sensitivity for the particular photosensitive layer, antifoggants and stabilisers may be added as is known in the art. Antifoggants that may be useful in silver halide emulsions according to the present invention include, for example, azaindenes such as tetraazaindenes, tetrazoles, benzotriazoles, imidazoles and benzimidazoles. Specific antifoggants that may be used include 5-carboxy-2-methylthio-4-hydroxy-6-methyl-1,3,3a,7-tetraazaindene, 1-(3-acetamidophenyl)-5-mercaptotetrazole, 6-nitrobenzimidazole, 2-methylbenzimidazole and benzotriazole.

Development boosters may be used. Booster compounds that may be present in the photographic material (or alternatively, in the developer solution used) include amine boosters that comprise at least one secondary or tertiary amino group and have an n-octanol/water partition coefficient (log P) of at least 1, preferably at least 3. Suitable amine boosters include those described in U.S. Pat. No. 5,512,415, col. 7, line 27 to col. 8, line 16, the disclosure of which is incorporated herein by reference. Preferred boosters are bis-tertiary amines and bis-secondary amines, preferably comprising dipropylamino groups linked by a chain of hydroxypropyl units, such as those described in U.S. Pat. No. 6,573,021.

The photosensitive silver halide contained in the photosensitive layers may be processed (according to a conventional development procedure) following exposure to form a visible image by associating the silver halide with an aqueous alkaline medium in the presence of a developing agent contained in the medium or in the material itself. The exposed photosensitive element may be processed in conventional developers to obtain very high contrast images. When the material contains an incorporated developing agent, it can be processed in the presence of an activator, which may be identical to the developer in composition, but lacking a developing agent.

The developers are typically aqueous solutions, although organic solvents, such as diethylene glycol, can also be included to facilitate the solution of organic components. The developers contain one or a combination of conventional developing agents, such as for example, a polyhydroxybenzene such as dihydroxybenzene, aminophenol, a paraphenylenediamine, ascorbic acid, erythorbic acid and derivatives thereof, pyrazolidone, pyrazolone, pyrimidine, dithionite and hydroxylamine.

It is preferred to employ hydroquinone and 3-pyrazolidone developing agents in combination or an ascorbic acid-based system. An auxiliary developing agent exhibiting super-additive properties may also be used. The pH of the developers can be adjusted with alkali metal hydroxides and carbonates, borax and other basic salts.

To reduce gelatin swelling during development, compounds such as sodium sulfate can be incorporated into the developer. Chelating and sequestering agents, such as ethylenediamine tetraacetic acid or its sodium salt, can be present. Generally any conventional developer can be used in the practice of this invention. Specific illustrative photographic developers are disclosed in the Handbook of Chemistry and Physics, 36th Edition, under the title "Photographic Formulae" at page 30001 et seq. and in "Processing Chemicals and Formulas", 6th Edition, published by Eastman Kodak Company (1963).

With regard to high contrast silver halide emulsions suitable for use in manufacturing printed circuit boards or for use in backplane electronics of display devices, for example, to which the present invention is particularly applicable, the silver halide emulsion is preferably a chlorobromide emulsion. Preferably, the silver halide emulsion comprises at least 40 mol % silver chloride, more preferably 50-90 mol % silver chloride and most preferably 50-80 mol % silver chloride. The remainder of the silver halide is preferably substantially made up of silver bromide and more preferably comprises a small proportion (e.g. up to 1 or 2%) of silver iodide.

Where the photosensitive layers comprise an emulsion of silver halide in gelatin, the weight ratio of silver to gelatin is preferably at least 2 to 1.

Whilst mentioned above that the number of photosensitive layers on each side of the support is not limited, except by the number of complementary but differently sensitised photosensitive layers it might be possible to stack and the desired utility, a particularly preferred embodiment of the invention has two differently sensitised photosensitive layers on one side of the support and optionally both sides of the support, said two photosensitive layers being separated by a photosensitive intermediate layer that is sensitised to a different spectral region from that of the two photosensitive layers it separates.

Where there are two photosensitive layers on one side of the support separated by a photosensitive intermediate layer, the two photosensitive layers are preferably sensitised in a complementary manner, whereby the first photosensitive layer is not sensitive to the wavelength of light used to expose the second photosensitive layer with its desired pattern, and vice versa. Optionally, a filter dye may be incorporated into the intermediate layer to improve separation of photosensitivity.

For example, in embodiments of the invention having a first photosensitive layer, a second photosensitive layer and a photosensitive intermediate layer, the three layers can be sensitised to red, blue and green light in any desired combination. Preferably, the first photosensitive layer is sensitised to red light, the photosensitive intermediate layer is sensitised to green light and the second photosensitive layer is sensitised to blue light, in order to minimise the effects of light scatter. Optionally, the first and second photosensitive layers can be additionally sensitised to the same spectral region as that of the photosensitive intermediate layer in order to enhance the formation of connective vias.

The conductive patterns formed by exposure and development of the photosensitive layers of the photosensitive element according to the invention preferably have a conductivity (expressed as resistivity) of 200 ohms/square or less, being achievable with the preferred silver halide emulsions and a conventional development step, more preferably 50 ohms/square or less. By exposing a photosensitive layer of the type used in the element of the invention to a desired pattern, and processing the exposed layer with a conventional development step and a physical development step, a conductivity of 10 ohms/square or less is achievable. By further adopting an electrochemical development (electroplating) step, still improved conductivity is achievable.

Another advantage of the method of the invention is the resolution of lines and gaps that is achievable. Effective conductive patterns may have a line width of, for example, 50 µm or less, optionally 20 µm or less or 10 µm or less. Preferably, for some applications conductive patterns having line widths in the range 1 to 8 µm may be formed. Typically, a minimum line width is necessary (e.g. at least 0.5 µm) in order to enable continuous conductivity throughout the conductive pattern. Similar resolutions (and preferred resolutions) apply to the gap widths that are achievable according to the method of the invention. For example, it is considered that a gap width of 10 µm or less is achievable.

Any suitable method of spectral sensitisation may be used as are common in photographic silver halide emulsions. Suitable such methods of spectral sensitisation are described, for example, in Research Disclosure, Item 37038, February 1995, Sections I to V.

Spectral sensitisation to provide differently sensitised photosensitive emulsions of silver halide, or layers thereof, can be carried out by any suitable method for use in the photographic arts.

The patents and publications referred to herein are incorporated by reference in their entirety.

The invention will now be described with reference to the following examples, which are not however to be construed as limiting the scope thereof.

EXAMPLES

Example 1

A multiple layer photosensitive element was prepared, which on the backside of a transparent support had an antihalation layer with protective topcoat, and on the front side an emulsion layer sensitive to green light, an emulsion layer sensitive to blue light, an emulsion layer sensitive to red light and finally a protective topcoat. The layers were prepared as follows.

The Antihalation Layer

A dispersion was prepared by dissolving 705 g of line-processed ossein gelatin, after soaking, in 13.3 kg of water at 49° C., adjusting the pH to 5.3 using dilute sulfuric acid, then adding 498 g of a 30 g/kg solution of a dye according to the following formula:

and 205.2 g of a 162 g/kg solution of 4-(4,5-dihydro-4-(5-(5-hydroxy-3-methyl-1-(4-sulfophenyl)-1H-pyrazol-4-yl)-2,4-pentadienylidene)-3-methyl-5-oxo-1H-pyrazol-1-yl) benzenesulfonic acid, which has the following formula;

and 320.7 g of a 195.3 g/kg solution of the sodium salt of 4-(3-(3-carboxy-5-hydroxy-1-(4-sulfophenyl)-1H-pyrazol-4-yl)-2-propenylidene)-4,5-dihydro-5-oxo-1-(4-sulfophenyl) 1H-pyrazole-3-carboxylic acid, with N,N-diethylethanamine, as shown in the following formula;

followed by 756.1 g of Ludox™ AM, a 30% silica dispersion available from W. R. Grace, followed by 104.0 g of glycerol [CAS No 56-81-5] as a 63% aqueous solution, followed by 48.2 g of polystyrene sulfonate [CAS No 25704-18-1] as 10% aqueous solution. The whole made up to 15.75 kg.

The Antihalation Layer Protective Topcoat

A dispersion was prepared by dissolving 519 g of lime-processed ossein gelatin, after soaking, in 3.8 kg of water at 49° C., then adding 465 g of an 8% aqueous dispersion of polymethacrylate matte beads (4-10 μm), followed by 0.5 kg of octamethylcyclotetrasiloxane [CAS No 556-67-2] as a 9.3% aqueous dispersion, followed by surfactants to ensure a good coating quality, the pH adjusted to 5.3 and the whole made up with water to 6 kg.

The two layers were then co-coated such that the gelatin in the antihalation layer was at 2 g/m² and the protective topcoat at 0.488 g/m² onto 7 thou clear subbed Estar® polyester base available from Kodak™.

Green-Sensitive Layer

A high contrast emulsion was used which consisted of a sulfur- and gold-sensitised 0.2 μm cubic silver bromochloride (AgBr$_{0.3}$Cl$_{0.7}$) in a binder system. The silver halide was sensitised to green light using potassium iodide and a sensitising dye: 1H-benzimidazolium, 5-chloro-2-(3-(1,3-dihydro-1-methyl-3-(3-sulfobutyl)-5-(trifluoromethyl)-2H-benzimidazol-2-ylidene)-1-propenyl)-3-ethyl-1-(2-hydroxyethyl)-6-(trifluoromethyl)-, inner salt

(CAS 161359-94-0)

The equivalent silver laydown was 2.5 g/m². The binder system consisted of lime-processed ossein gelatin at 1.1 g/m². The emulsion was protected against fogging by use of a tetraazaindene: 7-hydroxy-5-methyl-2-(methylthio)-(1,2,4)triazolo(1,5-a) pyrimidine-6-carboxylic acid, a phenyhnercaptotetrazole: N-(3-(2,5-dihydro-5-thioxo-1H-tetrazol-1-yl)phenyl)acetamide and 2,3-dihydro-2-thioxo-4-thiazoleacetic acid. The viscosity was adjusted to approximately 6 cP by use of polystyrene sulfonic acid at a pH of 5.1

Blue-Sensitive layer

A high contrast emulsion was used, which consisted of a sulfur- and gold-sensitised 0.2 μm cubic silver bromochloride (AgBr$_{0.3}$Cl$_{0.7}$) in a binder system. The silver laydown was 2.5 g/m². The binder system consisted of lime-processed ossein gelatin at 1.1 g/m². The emulsion was sensitised to blue light with 5-phenyl-2-((5-phenyl-3-(3-sulfopropyl)-2(3H)-benzoxazolylidene)methyl)-3-(3-sulfopropyl)benzoxazolium, inner salt, with N,N-diethylethanamine (1:1);

CAS 94393-23-4 and protected against fogging by use of potassium iodide, a soluble disulfide pentanoic acid, 5,5'-(dithiobis(4,1-phenyleneimino))bis(5-oxo-, disodium salt, and a phenyhnercaptotetrazole: N-(3-(2,5-dihydro-5-thioxo-1H-tetrazol-1-yl)phenyl)-acetamide. The viscosity was adjusted to approximately 25 cP by use of polystyrene sulfonic acid at a pH of 5.1.

Red-Sensitive Layer

A high contrast emulsion was used which consisted of a sulfur- and gold-sensitised 0.2 μm cubic silver bromochloride ($AgBr_{0.3}Cl_{0.7}$) in a binder system. The silver halide was sensitised to red light using potassium iodide and a sensitising dye;

The equivalent silver laydown was 2.5 g/m². The binder system consisted of lime-processed ossein gelatin at 1.1 g/m². The emulsion was protected against fogging by use of a tetraazaindene: 7-hydroxy-5-methyl-2-(methylthio)-(1,2,4)triazolo(1,5-a) pyrimidine-6-carboxylic acid, a phenylmercaptotetrazole: N-(3-(2,5-dihydro-5-thioxo-1H-tetrazol-1-yl)phenyl)acetamide and 2,3-dihydro-2-thioxo-4-thiazoleacetic acid. The viscosity was adjusted to approximately 25 cP by use of polystyrene sulfonic acid at a pH of 5.1

Protective Topcoat

A dispersion was prepared by dissolving 453.3 g of lime-processed ossein gelatin, after soaking in 846 g of water and 1642 g of a 4.7% aqueous solution of acidified hydroquinone at 49° C., cooling to 40° C. and then adding 286.3 g of a 13.5% dispersion of polydimethylsiloxane (DC-200™ available from Dow) [CAS No 63148-62-9] in 8.2% lime-processed ossein gelatin, followed by surfactants and polystyrene sulfonic acid to ensure a good coating quality, the pH adjusted to 5.5 and the whole made up to 4.0 kg. A second solution was prepared by dissolving 482.2 g of lime-processed ossein gelatin, after soaking in 1802 g of water at 49° C., cooled to 40° C. and then adding 513 g of a 300 g/kg latex polymeric solution of a blend of methyl acrylate, sodium salt of 2-acrylamido-2-methyl-propane sulfonic acid and 2-(methacryloxy)ethylacetoacetae (88:5:7) by weight, 256 g of a 200 g/l solution of 1,3-benzenedisulfonic acid, 4,5-dihydroxy-, disodium salt, 290.7 g of a 100 g/kg solution of a booster having the following formula;

and a further 569.8 g of a 4.7% aqueous solution of acidified hydroquinone, followed by surfactants and polystyrene sulfonic acid to ensure a good coating quality, the pH adjusted to 5.5 and the whole made up with water to 4.0 kg.

These two solutions were mixed together just prior to coating in a 1:2 ratio and the topcoat was coated at 1.488 g/m² of gelatin.

Three multilayer photosensitive elements, Elements A, B and C, were prepared according to the above method, but with Element A additionally having 1.0 g/m² of a blend of a latex copolymer, comprising methyl acrylate, sodium salt of 2-acrylamido-2-methyl-propane sulfonic acid and 2-(methacryloxy)-ethylacetoacetae (88:5:7) by weight, in the photosensitive intermediate layer (blue-sensitive layer), whilst Element B additionally consisted of 0.5 g/m² of the same blend of latex polymer and 0.5 g/m² gelatin coated polymethyl methacrylate (PMMA) matte beads with a mean diameter of 1.34 μm in the photosensitive intermediate layer and Element C additionally contained 0.75 g/m² of gelatin coated PMMA matte beads with a mean diameter of 1.34 μm, as well as 0.25 g/m² of gelatin coated PMMA matte beads with a mean diameter of 1.95 μm.

Multilayer conductive element C was then electroless plated by immersing the element in an electroless plating bath, the composition of which is set out below, for 5 minutes at room temperature, followed by a 2 minute wash in a 20 g/l solution of citric acid at room temperature, to form conductive element D.

| Electroless silver plating bath composition: | |
|---|---|
| ferric nitrate nonahydrate | 100 ml (40% w/w ferric nitrate) |
| citric acid | 26.25 g |
| water to | 800 ml |
| warm to >25° C. | |
| ammonium ferrous sulfate · 12H$_2$O | 97.5 g |
| water to | 1 litre |
| DDA** 10% | 12 ml |

-continued

| Electroless silver plating bath composition: | |
|---|---|
| Tween 80 | 2.5 ml |
| silver nitrate | 77.6 g (54% w/w AgNO$_3$) |
| water to | 1 litre |
| These were mixed just prior to use | |
| **DDA 10% | |
| water | 90 ml |
| dodecylamine | 7.5 g |
| acetic acid glacial | 2.5 g |

Each of the multilayer elements A, B, C and D described above was exposed through the same photomask with a 16 μs Xe flash with a Wratten™ 2B filter to remove the UV component. The exposed elements were then processed at 20° C. in Kodak Accumax™ chemistry for 3 minutes, fixed for 30 seconds and washed for a further 2 minutes. The coloured mask was produced using Kodak™ Endura clear material, exposed on a Durst Epsilon 30 colour plotter and processed as normal in RA4™ chemistry.

Three-layer conductive elements A, B, C and D were thereby formed. The pattern, which is illustrated diagrammatically in FIG. 1, comprises a vertical track (11, 13) formed in the upper red-sensitive layer of the photosensitive element intersected at intersection points (5, 9) with two horizontal tracks (15, 17) formed in the lower green-sensitive layer of the photosensitive element. End points (3) and (7) and intersection point (5) were formed through all three layers by exposing in all of the upper, lower and intermediate layers of the photosensitive element (forming interconnective vias), end point (1) was formed in the upper red-sensitive layer only of the photosensitive element and intersection point (9) was formed in the upper red-sensitive and lower green-sensitive layers of the photosensitive element, but not in the intermediate blue-sensitive layer of the photosensitive element, thereby forming a non-interconnective intersection by which it was intended to demonstrate the selective conductive or insulating nature of intersections between conductive tracks in the upper and lower layers of the multilayer conductive element.

Figure 1:
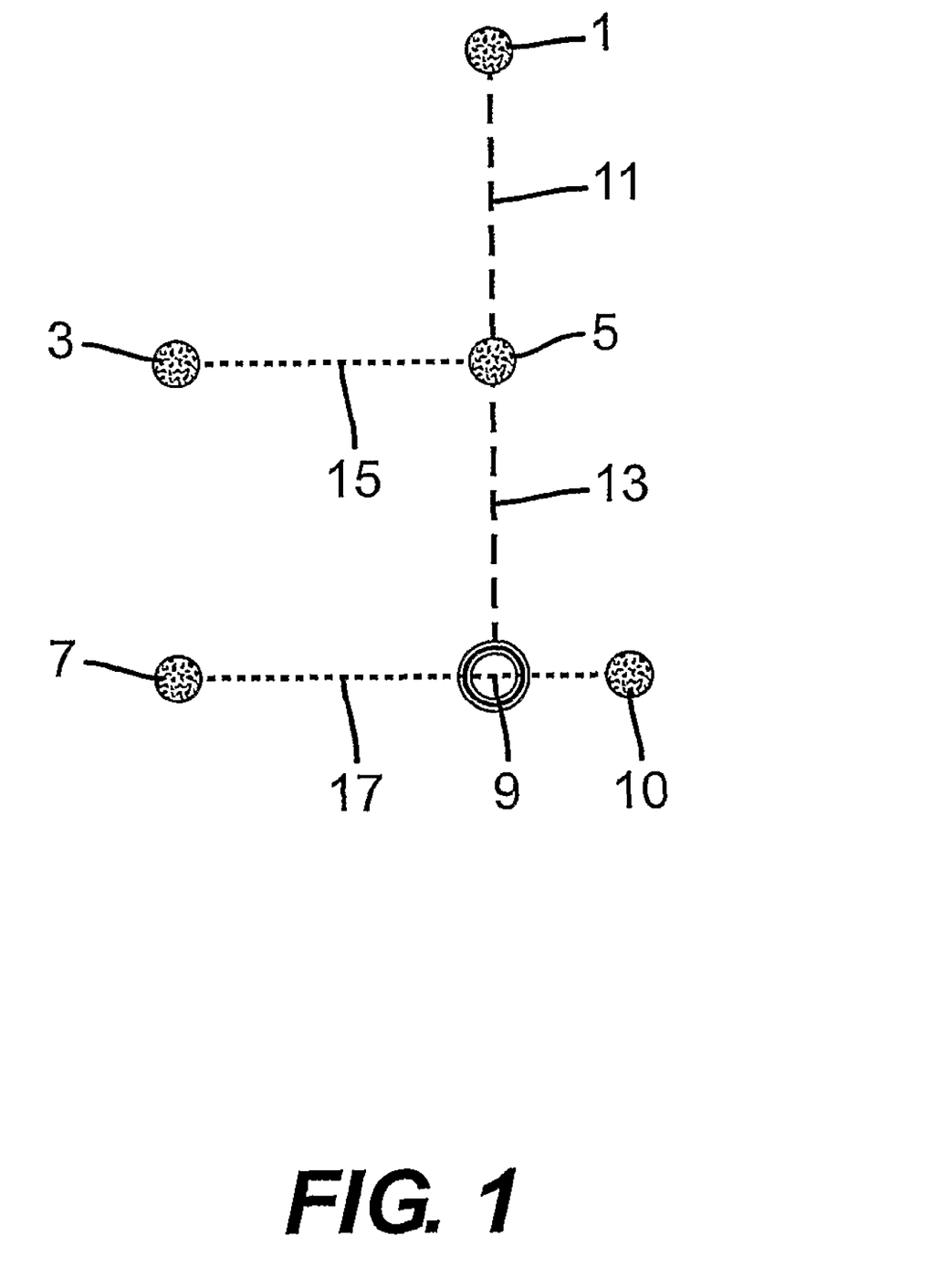
FIG. 1 is a diagrammatic representation of a three layer conductive element formed by the method of the invention.

To demonstrate the selective conductivity of tracks and interconnection in the multilayer conductive element of the invention, conductivity was measured (in terms of resistance) between several different points in each element. The resistance was measured between end point (1) and intersection point (9) to demonstrate the conductivity in the upper layer track (11, 13) (formed in the red-sensitive layer), between end point (3) and intersection point (5) to demonstrate the conductivity in the lower layer track (15) (formed in the green-sensitive layer), between end points (7) and (10) to demonstrate the conductivity in the lower layer track (17) (formed in the green-sensitive layer), between end points (1) and (3) to demonstrate the conductivity between the lower layer track (15) (formed in the green-sensitive layer) and the upper layer track (11) (formed in the red-sensitive layer) through the via formed at intersection point (5), and between end points (1) and (7) to demonstrate the lack of conductivity between the lower layer track (17) (formed in the green-sensitive layer) and the upper layer track (11, 13) (formed in the red-sensitive layer) as a result of there being no exposure in the intermediate layer at intersection point (9) and thereby not forming a via, in order to demonstrate the insulative effect of the intermediate layer of the multilayer conductive elements formed, A Fluke™ 77 digital voltmeter capable of measuring up to 30 kilo ohms was used. The measurements taken in each case are presented in Table 1.

TABLE 1

| Conductive element | Measured resistance (kilo ohms) between reference points | | | | |
|---|---|---|---|---|---|
| | Point 1 to point 9 | Point 3 to point 5 | Point 7 to point 10 | Point 1 to point 3 | Point 1 to point 7 |
| A | 9 | 17 | 18 | 18 | 1.2 M ohm |
| B | 6 | 7 | 18 | 6 | >30 M ohm |
| C | 22 | 17 | 38 | 18 | >30 M ohm |
| D | 8.5 | 1.5 | 0.7 | 1.5 | >30 M ohm |

As can be seen from Table 1, in all four multilayer conductive elements, the tracks in the upper layer and the tracks in the lower layer could not conduct to a significant degree through intersection point (9), i.e. from point 1 to point 7, which had an insulating intermediate section preventing conduction taking place. Also, in all three cases, good conductivity was observed between the upper layer and lower layer tracks through the interconnecting via (5). This demonstrates that multiple layer conductive tracks with selective interconnections can be formed using a multiple layer photosensitive element to form a thin, flexible element without having to face difficulties in registration of the two layers.

It will be observed that the use of Elements B and C, each incorporating PMMA matte beads, led to significant improvements in insulation between the first and second photosensitive layers, so that there was no measurable conductivity between these layers when the intermediate layer was unexposed.

As can also be seen from the results, electroless plating of multilayer conductive element C to form element D provides a conductive element having much improved conductivity without compromising the insulative properties of the interlayer as demonstrated by the high resistance shown by the measurement between points (1) and (7) of the conductive pattern.

The invention claimed is:

1. A method of manufacturing a multiple layer conductive element, said conductive element having three or more layers of electrically conductive material, each layer of said conductive material being conductive according to a desired pattern, said method comprising the steps of providing a photosensitive element comprising:

a support having coated on at least one side thereof a first photosensitive layer sensitive to radiation of a first spectral region;

a second photosensitive layer sensitive to radiation of a second spectral region, said second photosensitive layer being located respectively further away from said support than said first photosensitive layer; and a photosensitive intermediate layer located between said first and second photosensitive layers, said photosensitive intermediate layer being sensitive to radiation of a third spectral region being different from that of said first and second spectral regions and said layer containing at least one of a polymer latex, polymer beads and/or dielectric particles, said photosensitive intermediate layer and said first and second photosensitive layers being capable of, upon imagewise exposure according to a desired pattern and development, providing a metal image according to said desired pattern;

imagewise exposing each of said photosensitive layers and said photosensitive intermediate layer of said photosensitive element with radiation of an appropriate wavelength according to respective desired conductive patterns for each of said photosensitive layers to form a latent image in each of said photosensitive layers; and developing said photosensitive element to form a conductive metal pattern corresponding to the pattern of each latent image.

2. The method of claim 1, wherein said first photosensitive layer is sensitised to a different spectral region from that of said second photosensitive layer.

3. The method of claim 1, wherein said photosensitive intermediate layer is exposed to a pattern of connective posts to provide for electrical connection between the desired conductive patterns of said first and second photosensitive layers.

4. The method of claim 1, wherein said first and second photosensitive layers we also sensitive to radiation in the spectral region to which said photosensitive intermediate layer is exposed.

5. The method of claim 1, wherein said first photosensitive layer, said second photosensitive layer and said photosensitive intermediate layer comprise photosensitive silver halide in a polymer material, whereby exposure and development according to the desired pattern forms conductive silver tracks according to said desired pattern.

6. A multiple layer conductive element obtainable by the method of claim 1.

7. A photosensitive element comprising:

a support having coated on at least one side thereof a first photosensitive layer sensitive to radiation of a first spectral region;

a second photosensitive layer sensitive to radiation of a second spectral region, said second photosensitive layer being located respectively further away from said support than said first photosensitive layer; and a photosensitive intermediate layer located between said first and second photosensitive layers, said photosensitive intermediate layer being sensitive to radiation of a third spectral region being different from that of said first and second spectral regions and said layer containing at least one of a polymer latex, polymer beads and/or dielectric particles, said photosensitive intermediate layer and said first and second photosensitive layers being capable of, upon imagewise exposure according to respective desired patterns and development, providing conductive metal images according to said desired patterns.

8. The element of claim 7, wherein said first photosensitive layer is sensitised to a different spectral region from that of said second photosensitive layer.

9. The element of claim 7, wherein said first photosensitive layer, said second photosensitive layer and said photosensitive intermediate layer comprise photosensitive silver halide in a polymer material, whereby exposure and development according to the desired pattern forms conductive silver tracks according to said desired pattern.

10. The element of claim 9, wherein said polymer material is gelatin and the silver to gelatin ratio by weight is at least 1:2.

11. The element of claim 7, wherein said intermediate layer comprises additives to improve the insulating properties of said intermediate layer.

12. The element of claim 7 wherein said intermediate layer comprises polymethacrylate matte beads.

13. The element of claim 12 wherein the matte beads are smaller than 3 μm.

* * * * *